United States Patent [19]

Tsumura

[11] Patent Number: 5,796,306
[45] Date of Patent: Aug. 18, 1998

[54] WIDE RANGE VARIABLE OUTPUT AMPLIFIER APPARATUS WITH HIGH EFFICIENCY

[75] Inventor: Soichi Tsumura, Tokyo, Japan

[73] Assignee: NEC Corporation, Japan

[21] Appl. No.: 703,775

[22] Filed: Aug. 27, 1996

[30] Foreign Application Priority Data

Aug. 28, 1995 [JP] Japan .................. 7-219232

[51] Int. Cl.[6] .................. H03F 3/68; H03G 3/30
[52] U.S. Cl. .................. 330/124 R; 330/129; 330/279; 330/295
[58] Field of Search .................. 330/124 R, 129, 330/144, 145, 278, 279, 284, 285, 295

[56] References Cited

U.S. PATENT DOCUMENTS

| | | | |
|---|---|---|---|
| 5,101,173 | 3/1992 | DiPiazza et al. | 330/144 X |
| 5,561,395 | 10/1996 | Melton et al. | 330/295 X |

FOREIGN PATENT DOCUMENTS

| | | |
|---|---|---|
| 58083437 | 5/1981 | Japan . |
| 58-83437 | 5/1983 | Japan . |
| 63501258 | 5/1985 | Japan . |
| 60-212013 | 10/1985 | Japan . |
| 3104408 | 5/1991 | Japan . |

*Primary Examiner*—James B. Mullins
*Attorney, Agent, or Firm*—Ostrolenk, Faber, Gerb & Soffen, LLP

[57] ABSTRACT

In a variable output amplifier apparatus, an input signal is distributed by a distributing unit as first signals to a plurality of variable gain units having different gains. Second signals generated from the variable gain units are combined by a combining unit to generate an output signal. A plurality of power supply control units apply power supplies to the variable gain units, respectively. The variable gain units and the power supply control units are controlled by a control unit. When one of the variable gain units and one of the power supply control units are activated, the corresponding power supply is turned ON. When they are deactivated, the corresponding power supply is turned OFF.

7 Claims, 10 Drawing Sheets

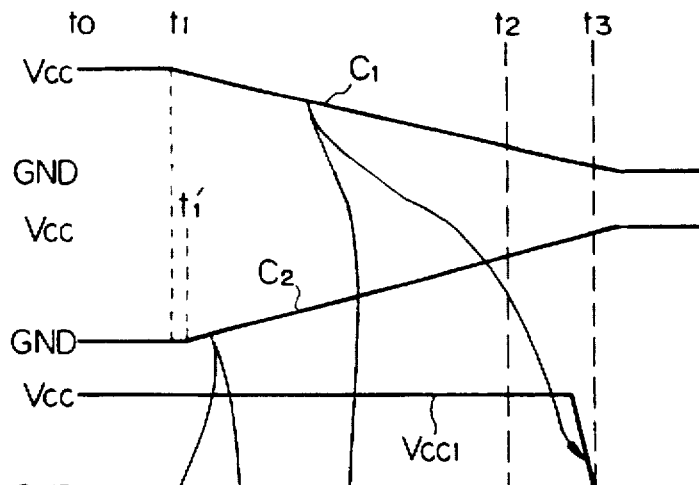
Fig. 5A
Fig. 5B
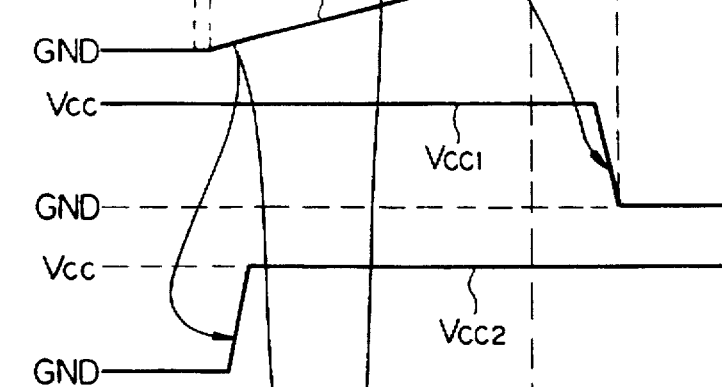
Fig. 5C
Fig. 5D
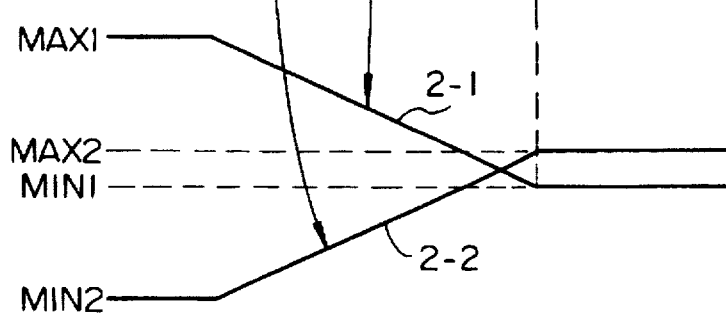
Fig. 5E

WIDE RANGE VARIABLE OUTPUT AMPLIFIER APPARATUS WITH HIGH EFFICIENCY

BACKGROUND OF THE INVENTION

1. Field of the Invention

The present invention relates to a variable output amplifier apparatus used in a transmitter for mobile communications or the like which imposes severe restrictions on power dissipation.

2. Description of the Related Art

Generally, a communication state of mobile communication apparatuses is poor as compared with a communication state of wire communication apparatuses. Particularly, in the mobile communication apparatuses, the level of reception signals fluctuates greatly. For example, in cellular telephones, the range of this intensity is about 80 dB to 100 dB.

In a prior art mobile communication system, since it is difficult to superimpose information on the amplitude components of carriers, such information is superimposed onto the frequency components of the carriers, which is called constant envelope modulation. According to this modulation, it is possible to reproduce original information by carrying out a nonlinear processing such as saturation amplification, and also, it is possible to remove harmonic components due to the saturation amplification by using bandpass filters. Therefore, saturation amplification is carried out both in transmission and reception. As a result, in a receiving apparatus, the above-mentioned large fluctuation of received signal level is absorbed. On the other hand, in a transmitting apparatus, effective use is made of a power supply by employing the efficiency of the nonlinear amplification.

Incidentally, as demands for mobile communications have been increasing, linear modulation systems and multi-valued transmission systems have been considered. In the linear modulation systems and the multi-valued transmission systems, however, if a nonlinear processing is carried out, the occupied bandwidth is broadened and the information superimposed on the amplitude of carriers is destroyed. Thus, a wide range variable output amplifier apparatus is required in a transmitter side and a receiving side of such systems.

On the other hand, in a direct sequence code division multiple access (DS-CDMA) in which a plurality of mobile stations use the same frequency band simultaneously, a base station has to receive signals from all the mobile stations at approximately the same level. That is, if the intensity of a signal from one mobile station is too strong, it is difficult to exclude its effect on the other mobile stations, which reduces actual transmission capacity. Thus, a wide range variable output amplifier apparatus is also required in the transmitting side of the systems.

In a first prior art variable output amplifier apparatus for a power transmission system (see: JP-A-58-83437), an input signal is amplified by first and second power amplifiers. A part of an output signal of the second power amplifier is fed back by a directional coupler to a detector. The directional coupler also feeds an output signal. A control circuit compares an output of the detector with a reference voltage, and as a result, a power supply of the first power amplifier is controlled in accordance with the comparison result of the output of the detector with the reference voltage. In addition, when the transmission power is low, a changeover switch is selected, so that the power supply of the second power amplifier is switched to the same power supply for the first power amplitude. This will be explained later in detail.

In the first prior art apparatus, however, when the changeover switch is switched, a large noise spike is generated during a transient state. Also, since the gains of the power amplifiers are controlled by their power supply, the input/output impedance conditions of the power amplifiers are changed. Further, the operation of the detector over a wide range (from approximately 80 dB to 100 dB) is too difficult.

In a second prior art variable output amplifier apparatus (see: JP-A-60-212013), a plurality of first amplifiers are connected in parallell for receiving an input signal. The first amplifiers are connected via a first changeover switch to a plurality of second amplifiers connected in parallel which are connected via a second changeover switch to a detector. The second changeover switch feeds an output signal. The output signal of the detector is supplied to a selection determination circuit for controlling the changeover switches. In particular, the selection determination circuit selects an optimum combination of one of the first amplifiers and one of the second amplifiers in accordance with the output of the detector. This will also be explained later in detail.

Even in the second prior art apparatus, however, when the changeover switches are switched to control the gain, a large noise spike is generated during a transient state. Also, changing the signal path causes a change in the delay time, and thus, an interruption may occur in an otherwise continuous signal.

SUMMARY OF THE INVENTION

It is an object of the present invention to provide a wide range variable output apparatus with a high efficiency.

According to the present invention, in a variable output amplifier apparatus, an input signal is distributed by a distributing unit as first signals to a plurality of variable gain units having different gain and maximum output power. Second signals generated from the variable gain units are combined by a combining unit to generate an output signal. A plurality of power supply control units apples power to each of the variable gain units, respectively. The variable gain units and the power supply control units are controlled by a control unit. When one of the variable gain units and one of the power supply control units are activated, the corresponding power supply is rapidly turned ON. When they are deactivated, the corresponding power supply is slowly turned OFF.

When the power supply is rapidly turned ON, the gain of the corresponding variable gain unit is still low, so that noise due to the turning ON of the power supply can be neglected. Also, when the power supply is slowly turned OFF, the gain of the corresponding variable gain unit is already low, so that noise due to the turning OFF of the power supply can be also neglected.

BRIEF DESCRIPTION OF THE DRAWINGS

The present invention will be more clearly understood from the description as set forth below, in comparison with the prior art, with reference to the accompanying drawings, wherein:

FIGS. 5A through 5E are timing diagrams showing the operation of the apparatus of FIG. 3;

DESCRIPTION OF THE PREFERRED EMBODIMENTS

Before the description of the preferred embodiments, prior art variable output amplifier apparatuses will be explained with reference to FIGS. 1 and 2.

Figure 1:
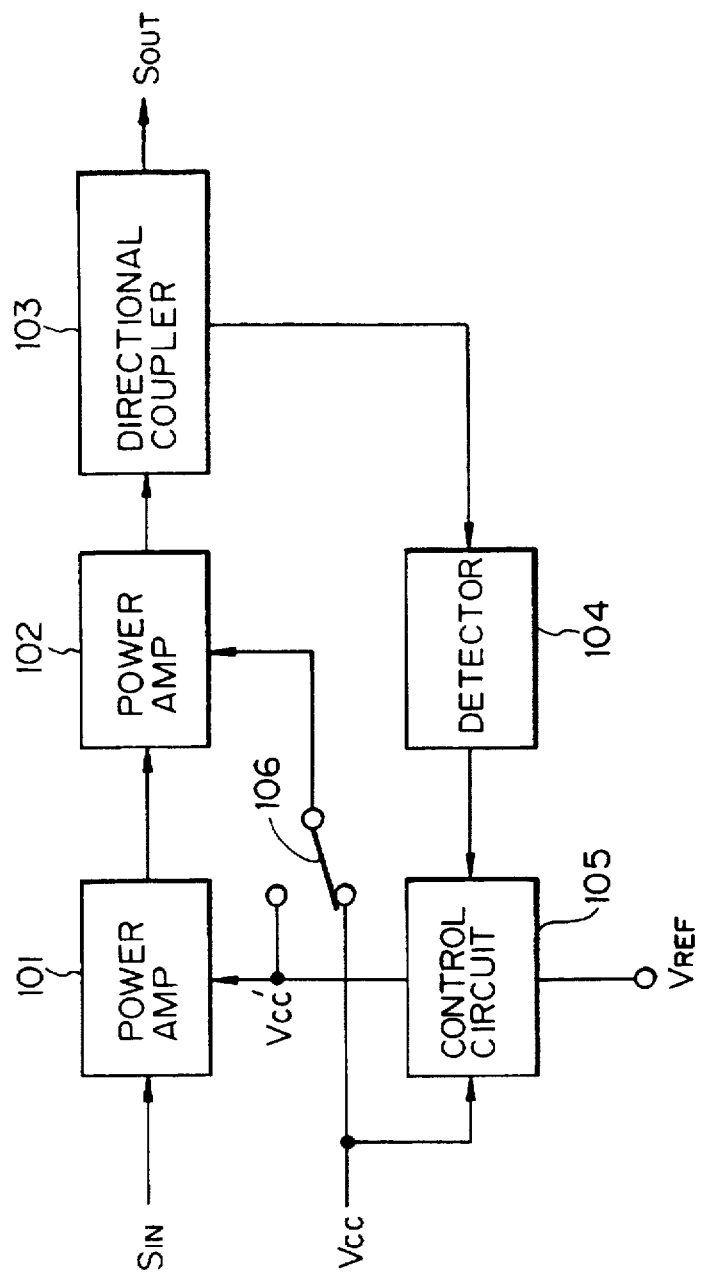
FIG. 1 a block diagram illustrating a first prior art variable output amplifier apparatus.

FIG. 1 illustrates a first prior art variable output amplifier apparatus for a power transmission system (see:JP-A-58-83437). An input signal $S_{IN}$ is amplified by power amplifiers 101 and 102. A part of an output signal of the power amplifier 102 is fed back by a directional coupler 103 to a detector 104. The directional coupler 103 also feeds an output signal $S_{OUT}$. A control circuit 105 compares a transmission power level detected by the detector 104 with a reference voltage $V_{REF}$, and as a result, a power supply $V_{CC}'$ of the power amplifier 101 is controlled in accordance with the comparison result of the transmission power level with the reference voltage $V_{REF}$. In addition, when the transmission power is low, a changeover switch 106 is selected at an upper position, so that the power supply of the power amplifier 102 is switched from $V_{CC}$ to $V_{CC}'$.

In FIG. 1, however, when the changeover switch 106 is switched, a large noise spike is generated during a transient state. Also, since the gains of the power amplifiers 101 and 102 are controlled by their power supply, the input/output impedance conditions of the power amplifiers 101 and 102 are changed. Generally, when the power supply is greatly changed, it is very difficult to maintain the characteristics of the power amplifier. Further, the operating of the detector 104 over a wide range (from approximately 80 dB to 100 dB) is too difficult.

Figure 2:
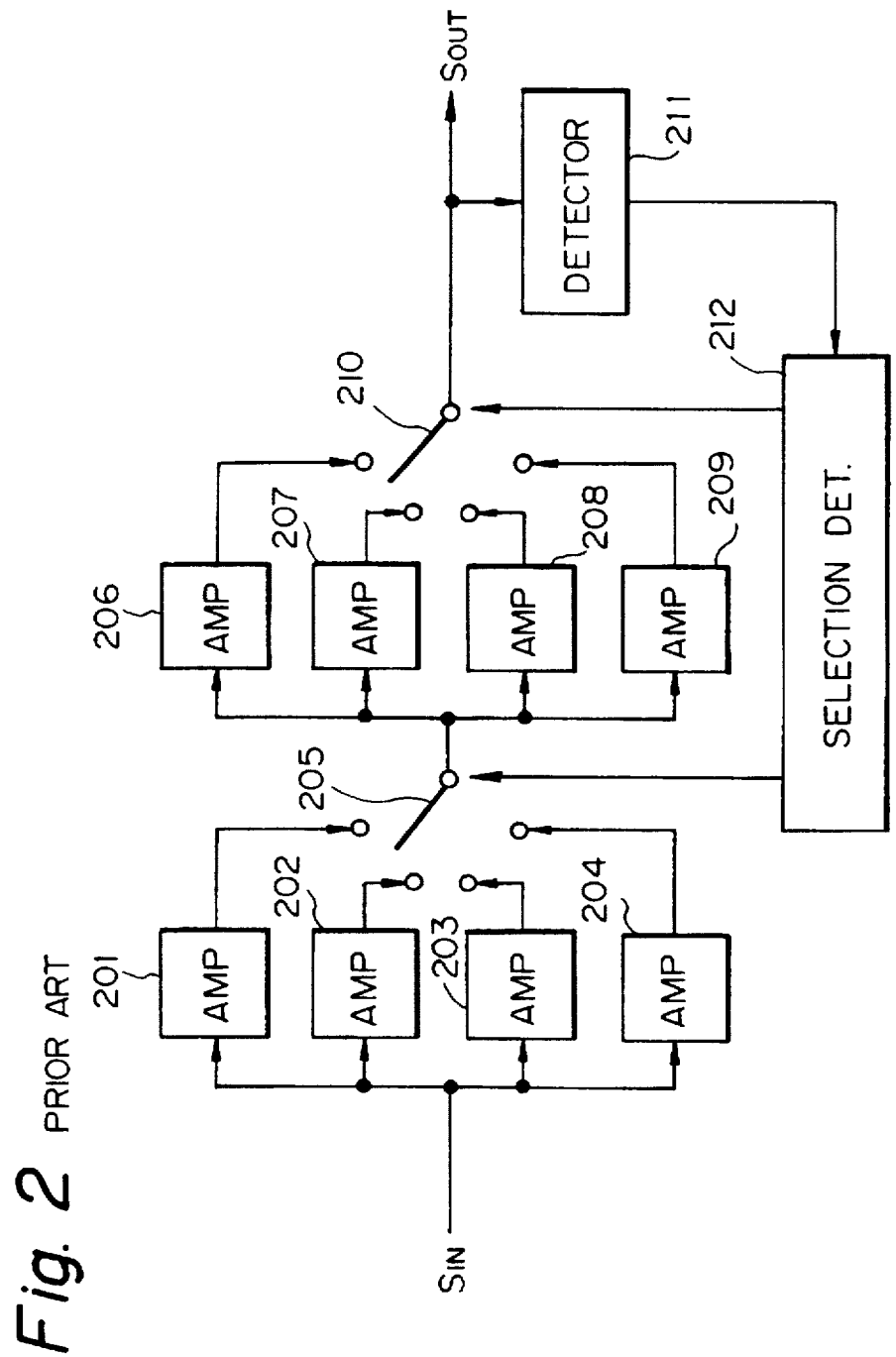
FIG. 2 is a block diagram illustrating a second prior art variable output amplifier apparatus.

FIG. 2 illustrates a second prior art variable output amplifier apparatus (see:JP-A-60-212013). Four amplifiers 201 through 204 are connected in parallel for receiving an input signal $S_{IN}$. The amplifiers 201 through 204 are connected via a changeover switch 205 to four amplifiers 206 through 209 which are also connected in parallel The four amplifiers 206-209 are connected via a changeover switch 210 to a detector 211. The changeover switch 210 feeds an output signal $S_{OUT}$. The output signal of the detector 211 is supplied to a selection determination circuit 212 for controlling the changeover switches 205 and 210. In particular the selection determination circuit 212 selects an optimum combination of one of the amplifiers 201 through 204 and one of the amplifiers 206 through 209 in accordance with the output of the detector 211.

In FIG. 2, however, when the changeover switches 205 and 210 are switched to control the gain, a large noise spike is generated during a transient state. Also, changing the a signal path changes the delay time, and thus, an interruption may occur in an otherwise continuous signal.

Figure 3:
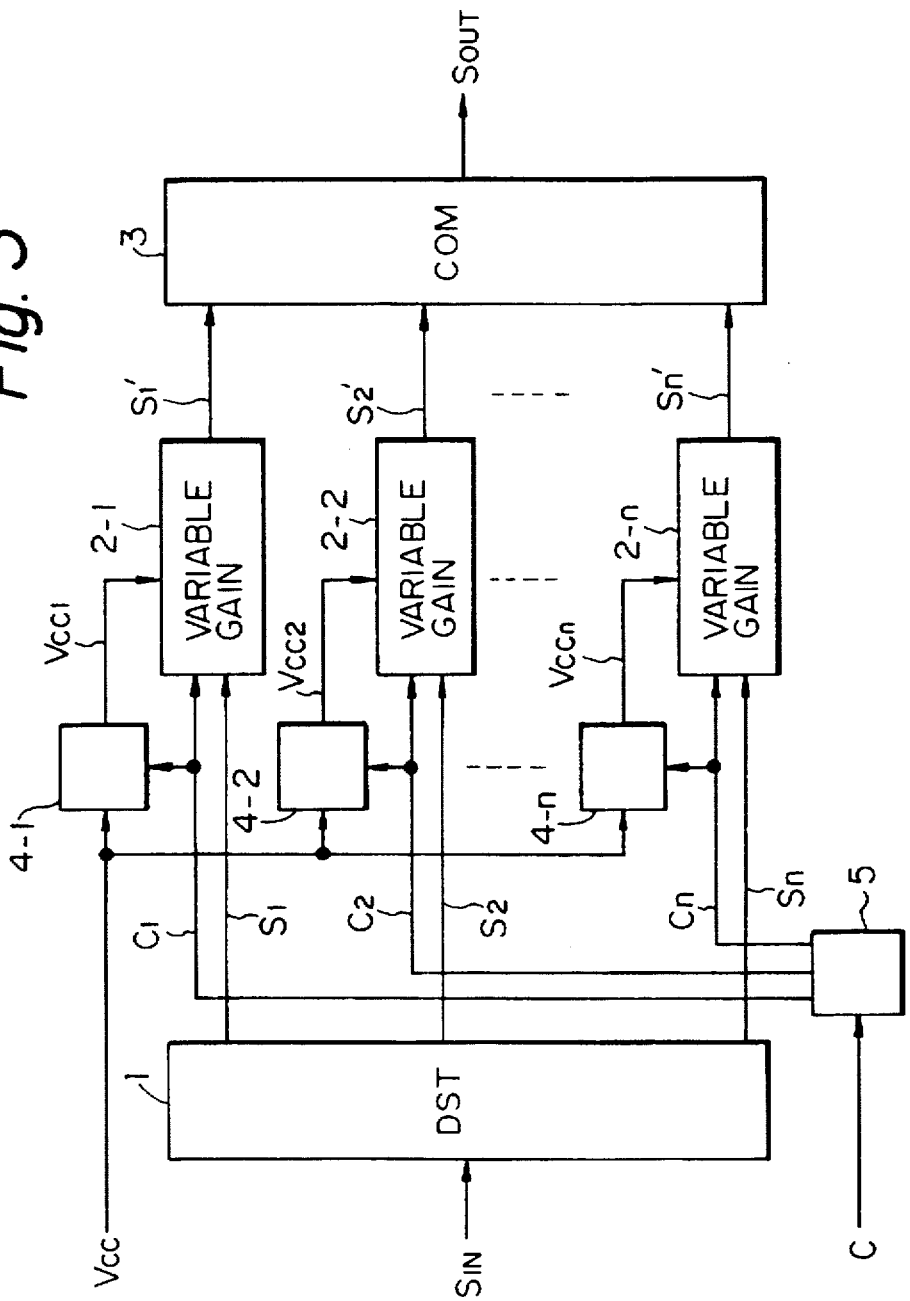
FIG. 3 is a block diagram illustrating a first embodiment of the variable output amplifier according to the present invention.

FIG. 3 illustrates a first embodiment of the present invention. A distributing unit 1 distributes an input signal $S_{IN}$ N as signals $S_1, S_2, \ldots, S_n$ to variable gain units 2-1, 2-2, ... 2-n, respectively. Output signals $S_1', S_2', \ldots, S_n'$ of the variable gain units 2-1, 2-2, ..., 2-n are combined by a combining unit 3 to generate an output signal $S_{OUT}$.

Power supply voltages $V_{CC1}, V_{CC2}, \ldots, V_{CCn}$ are applied to the variable gain units 2-1, 2-2, ..., 2-n from power supply control units 4-1, 4-2, ..., 4-n, respectively, which commonly receive a power supply $V_{CC}$.

The variable gain units 2-1, 2-2, ..., 2-n and the power supply control units 4-1, 4-2, ..., 4-n are controlled by control signals $C_1, C_2, \ldots, C_n$, respectively, of a control unit 5 which receives a gain contol signal C. When the control signal $C_1$ is sloped from low to high, for example, the power supply control unit 4-1 promptly raises the power supply $V_{CC1}$ from GND to $V_{CC}$, and then, the gain of the variable gain unit 2-1 gradually starts to change from the minimum value to the maximum value. On the other hand, when the control signal $C_1$ is sloped from high to low, the gain of the variable gain unit 2-1 starts to gradually change from the maximum value to the minimum value, and then, the power supply control unit 4-1 switches the power supply $V_{CC1}$ from $V_{CC}$ to GND.

Figure 4:
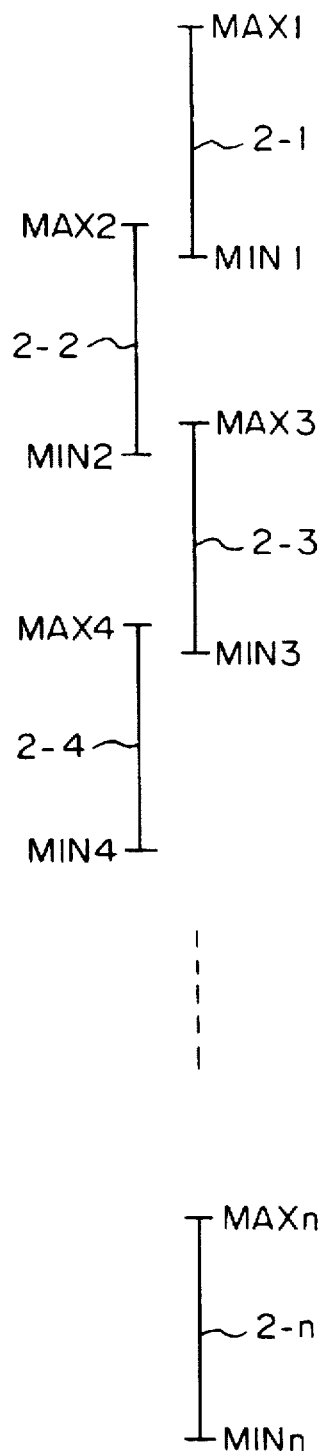
FIG. 4 is a diagram showing gains of the variable gain units of FIG. 3.

Examples of the gains of the variable gain units 2-1, 2-2, ..., 2-n are shown in FIG. 4. In particular the gain of the variable gain unit 2-1 ranges from MAX1 to MIN1; the gain of the variable gain unit 2-2 ranges from MAX2 to MIN2; ... ; and the gain of the variable gain unit 2-n ranges from MAXn to NINn. In this case, the value MIN1 is smaller than the value MAX2, the value MIN2 is smaller than value MAX3, and so on.

An example of the operation of the variable amplifier apparatus of FIG. 3 is explained next with reference to FIGS. 5A through 5E.

First, at time to, the control signals $C_1$ and $C_2$ are $V_{CC}$ and GND, respectively, as shown in FIGS. 5A and 5B, and accordingly, the power supplys $V_{CC1}$ and $V_{CC2}$ are $V_{CC}$ and GND, respectively, as shown in FIGS. 5C and 5D. Also, the gain of the variable gain unit 2-1 is MAX1, and the gain of the variable gain unit 2-2 is MIN2, as shown in FIG. 5E.

Next, at time $t_1$, the control signal $C_1$ starts to slope from $V_{CC}$ to GND, and almost simltaneously, at time $t_1'$, the contol signal $C_2$ starts to slope from GND to $V_{CC}$. As a result, the power supply $V_{CC2}$ is switched by the power supply control unit 4-2 from GND to to $V_{CC}$. Here, noise may be generated due to the rising of the power supply $V_{CC2}$ in the variable gain unit 2-2, however, such noise can be neglected since the gain of the variable gain unit 2-2 is still substantially equal to MIN2. Also, as shown in FIG. 5E, the gain of the variable gain unit 2-1 is gradually decreased by the falling of the control signal $C_1$, and the gain of the variable gain unit 2-2 is gradually increased.

At time $t_2$, the gain of the variable gain unit 2-1 reaches MIN1, while the gain of the variable gain unit 2-2 reaches MAX2.

Finally, at time $t_3$, the power supply $V_{CC1}$ is switched by the power supply control unit 4-1 from $V_{CC}$ to GND. Here, noise may be generated due to the falling of the power supply $V_{CC1}$ in the variable gain unit 2-1, however, such noise can be neglected since the gain of the variable gain unit 2-1 is already MIN1.

Note that a signal delay of each of the variable gain units 2-1, 2-2, ..., 2-n is equalized through the maximum gain control state to the minimum gain control state. Therefore, the output signal $S_{OUT}$ of the combining unit 3 is smoothly switched from the maximum gain of the variable gain unit 2-1 to the maximum gain of the variable gain unit 2-2.

Generally, the larger the gain of the variable gain unit, the larger the power dissipation. Therefore, one of the variable gain units 2-1, 2-2, . . . , 2-n which are optimized its power dispation at its maximum output power is selected, which can use the power supply effectively.

Also, in the variable output amplifier apparatus of FIG. 3, if only one of the variable gain units 2-1, 2-2, . . . , 2-n is selected, the gain of the apparatus of FIG. 3 can be discretely changed from MAX1, MAX2, . . . , MAXn, to MIN1, MIN2, . . . MINn, as shown in FIG. 4. Therefore, if the number of the variable gain units 2-1, 2-2, . . . , 2-n is increased, the gain of the apparatus of FIG. 3 can be almost continuously changed from MIN1 to MAXn.

Figure 6:
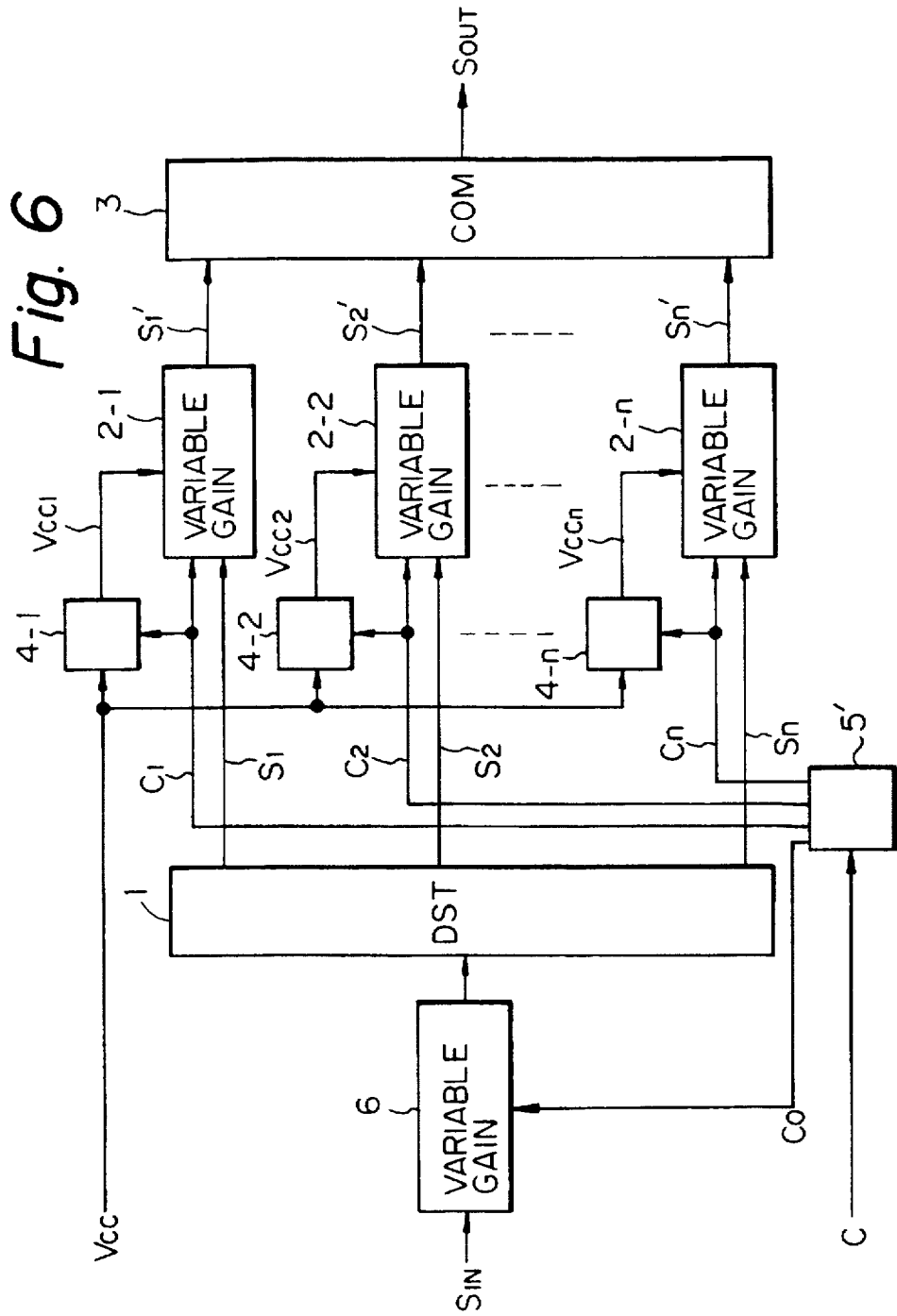
FIG. 6 is a block diagram illustrating a second embodiment of the variable output amplifier according to the present invention.

In FIG. 6, which illustrates a second embodiment of the present invention, a variable gain unit 6 is added to the elements of FIG. 3, thus obtaining a completely continuous change of the gain of the apparatus. The variable gain unit 6 is controlled by a control signal $C_0$ that is generated by a control unit 5'. In this case, the range of gain of the variable gain unit 6 is small, for example, from 0 to MAX, where MAX is larger than MAX2 in FIG. 4.

Figure 7A:
FIGS. 7A, 7B, 7C and 7D are timing diagrams showing operation of the control unit of FIG. 6.
Figure 7B:
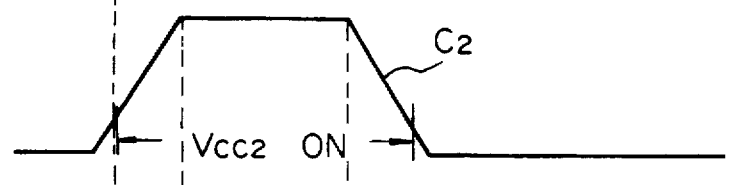
Figure 7C:
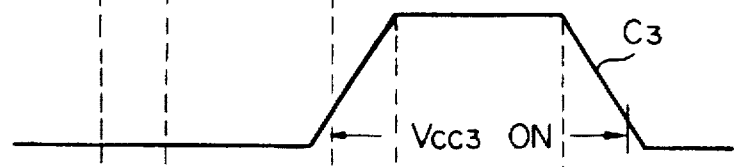
Figure 7D:
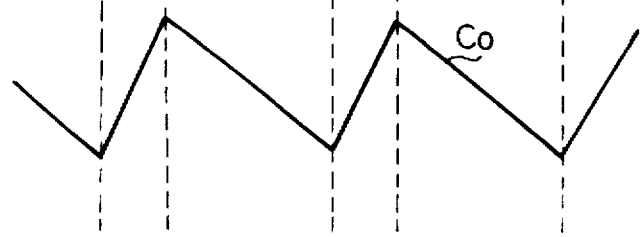

An example of the operation of the control unit 5' is explained with reference to FIGS. 7A, 7B, 7C and 7D. Here, assume that the gain control signal C is gradually decreased so that the variable gain units 2-1, 2-2, . . . , 2-n are sequentially activated as shown in FIGS. 7A, 7B and 7C. In this case, as shown in FIG. 7D, the level of the gain control signal $C_0$ for the variable gain unit 6 is gradually and stepwise decreased as the gain control signal C is gradually decreased. Therefore, the control unit 5' can be formed by a voltage divider or the like in addition to the elements of the control unit 5 of FIG. 3.

Each element of the apparatuses of FIGS. 3 and 6 will be explained next.

Figure 8:
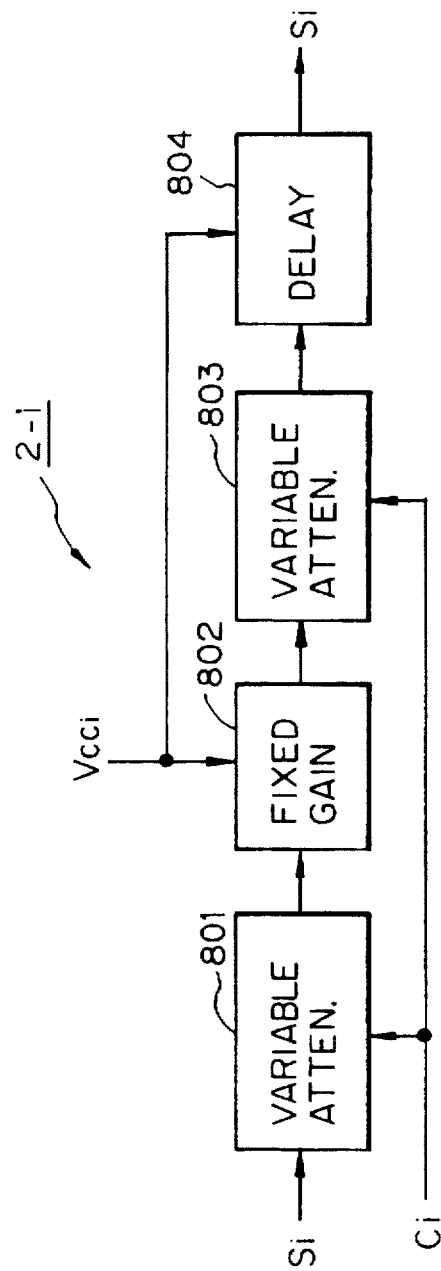
FIG. 8 is a detailed block diagram of each of the variable gain units of FIGS. 3 and 6.

In FIG. 8, which is a detailed circuit diagram of the variable gain unit 2-i (i=1, 2, . . . , n) of FIGS. 3 and 6, the signal $S_i$ passes through a variable attenuation unit 801, a fixed gain unit 802, a variable attenuation unit 803 and a delay unit 804. In this case, the variable attenuation units 801 and 803 are controlled by the control signal $C_i$, while the fixed gain unit 802 and the delay unit 804 are activated by the power supply $V_{CCi}$. The maximum attenuations of the variable attenuation units 801 and 803 are larger than the maximum gain of the fixed gain unit 802. The delay time of the delay unit 804 compensates for the fluctuation of the variable attenuation units 801 and 803 so that the delay times of the variable gain units 2-1, 2-2, . . . , 2-n are equalized.

Also, the attenuations of the variable attenuation units 801 and 803 defining the gain of the variable gain unit 2-i are gradually changed in response to the change of the control signal $C_i$. Thus, the gain of the variable gain unit 2-i is gradually changed as shown in FIG. 5E.

Further, the fixed gain unit 802 is turned ON and OFF when the attenuations of the variable attenuation units 801 and 803 are maximum. Therefore, even when the input/ output impedance of the fixed gain unit 802 is fluctuated, there is no adverse effect on the input signal $S_i$ and the output signal $S_i'$.

Figure 9:
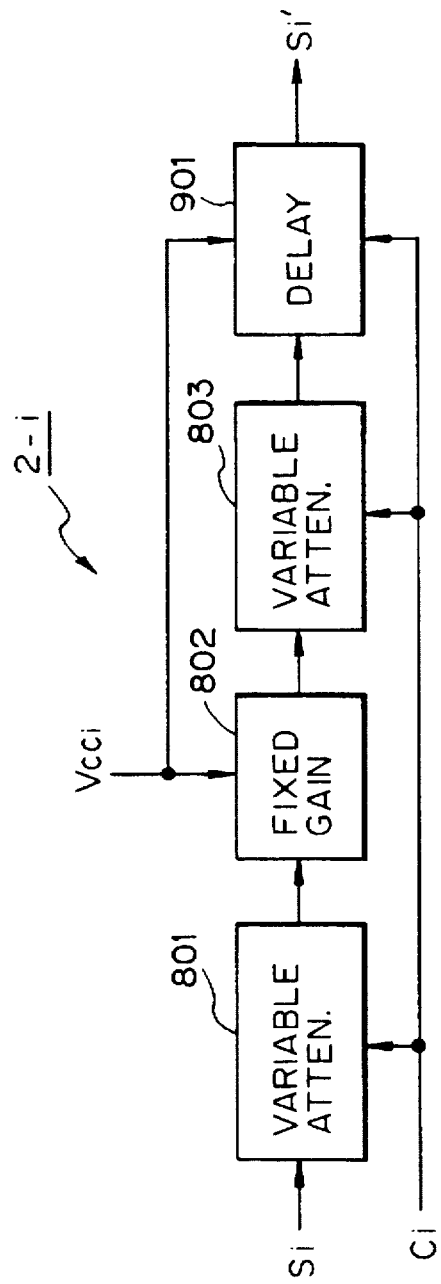
FIG. 9 is a block diagram illustrating a modification of the variable gain unit of FIG. 8.

In FIG. 9, which is a modification of the variable gain unit 2-i of FIG. 8, a delay unit 901 is provided instead of the delay unit 804 of FIG. 8. In particular, the delay unit 901 is also controlled by the control signal $C_i$, so that the delay time of the entire variable gain unit 2-i is almost constant regardless of the change of the gain thereof.

Figure 10:
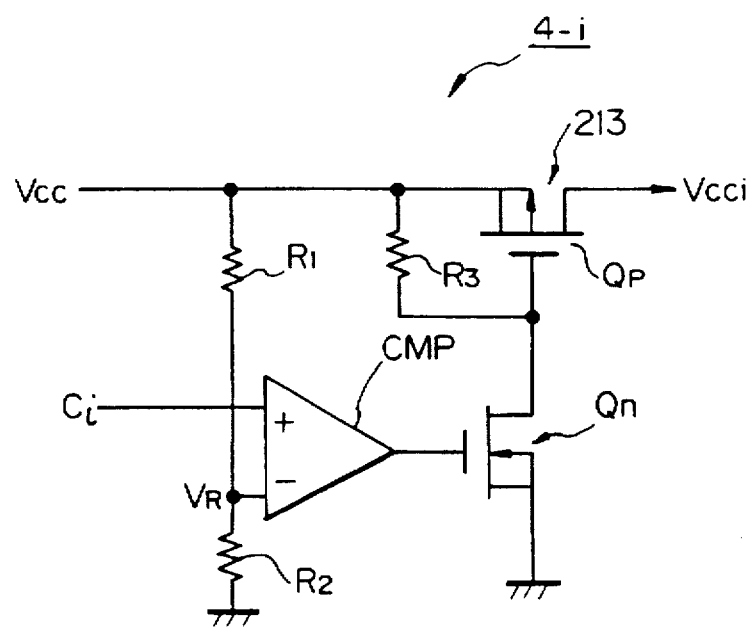
FIG. 10 is a detailed circuit diagram of the power supply control circuit of FIGS. 3 and 6.

In FIG. 10, which is a detailed circuit diagram of the power supply control unit 4-i (i=1, 2, . . . , n) of FIGS. 3 and 6, a comparator CMP compares the voltage of the signal $C_i$ with a reference voltage $V_R$ defined by resistors $R_1$ and $R_2$, so as to control an N-channel MOS transistor $Q_n$. Also, a P-channel MOS transistor $Q_p$ is interposed between an input for the power supply $V_{CC}$ and an output for the power supply $V_{CCi}$, and is controlled by the N-channel MOS transistor $Q_n$. Further, a resistor $R_3$ is connected between the gate of the P-channel MOS transistor $Q_p$ and the input for the power supply $V_{CC}$.

When the voltage of the signal $C_i$ becomes higher than $V_R$, the comparator CMP turns ON the N-channel MOS transistor $Q_n$, so that the gate voltage of the P-channel MOS transistor $Q_p$ becomes low (=GND). As a resut, the P-channel MOS transistor $Q_p$ is rapidly turned ON. Thus, the power supply $V_{CCi}$ rapidly becomes $V_{CC}$ (see FIGS. 5B and 5D).

On the other hand, when the voltage of the signal $C_i$ becomes lower than $V_R$, the comparator CMP turns OFF the N-channel MOS transistor $Q_n$. However, in this case, due to the presence of the resistor $R_3$, the gate voltage of the P-channel MOS transistor $Q_P$ becomes high (=$V_{CC}$). As a result, the P-channel MOS transistor $Q_P$ is turned OFF. Thus, the power supply $V_{CCi}$ becomes GND (see FIGS. 5A and 5C).

As explained hereinabove, according to the present invention, a large amount of noise due to the switching of the power supply can be avoided. Also, the power supply can be used effectively.

I claim:

1. A variable output amplifier apparatus, comprising:
   a distributing unit for receiving an input signal to generate a plurality of first signals;
   a plurality of variable gain units connected to said distributing unit, each of said variable gain units having a gain for amplifying said first signals and outputting second signals;
   a combining unit, connected to said variable gain units, for combining said second signals into an output signal;
   a plurality of power supply control units, each connected to one of said variable gain units, for applying power supplies to said variable gain units; and
   a control unit, connected to said variable gain units and said power supply control units, for controlling said variable gain units and said power supply control units,
   a first one of said variable gain units and a first one of said power supply control units connected to said first variable gain unit being activated by said control unit, so that said first power supply control unit promptly turns ON the power supply applied to said first variable gain unit before the gain of said first variable gain unit is gradually increased from a first minimum value to a first maximum value,
   a second one of said variable gain units and a second one of said power supply control units connected to said second variable gain unit being deactivated by said control unit, so that said second power supply control unit turns OFF the power supply applied to said second variable gain unit after a time period has passed and the gain of said second variable gain unit is gradually decreased from a second maximum value to a second minimum value.

2. The apparatus as set forth in claim 1, wherein said control unit deactivates one of said variable gain units and one of said power supply control units and simultaneously activates another of said variable gain units and another of said power supply control units.

3. The apparatus as set forth in claim 1, further comprising an additional variable gain unit connected to a prestage of said distributing unit, a gain of said additional variable gain unit being continuously and stepwise controlled by said control unit.

4. The variable output apparatus of claim 1, wherein the power supply applied to said first variable gain unit ramps from about zero to a power supply value during a first period of time after being turned ON and the gain of said first variable gain unit is gradually increased from a first minimum value to a first maximum value during a second period of time, the first period of time being substantially less than the second period of time.

5. The variable output apparatus of claim 1, wherein the power supply applied to said second variable gain unit ramps from a power supply value to about zero during a first period of time after being turned off and the gain of said second variable gain unit is gradually decreased from a second maximum value to a second minimum value during a second period of time, the first period of time being substantially less than the second period of time.

6. A variable output amplifier apparatus, comprising:

a distributing unit for receiving an input signal to generate a plurality of first signals;

a plurality of variable gain units connected to said distributing unit, for amplifying said first signals and outputting second signals wherein each of said variable gain units comprises:

a first variable attenuation unit for receiving one of said first signals, said first variable attenuation unit being controlled by said control unit;

a fixed gain unit connected to said first variable attenuation unit, said fixed gain unit being powered by one of said power supplies;

a second variable attenuation unit connected to said fixed gain unit; and a delay unit, connected to said second variable attenuation unit, for generating one of said second signals, said delay unit being powered by one of said power supplies; and wherein maximum attenuations of said first and second variable attenuation units being larger than a maximum gain of said fixed gain unit;

said variable output amplifier apparatus further comprising:

a combining unit, connected to said variable rain units, for combining said second signals into an output signal;

a plurality of power supply control units, each connected to one of said variable gain units, for applying power supplies to said variable gain units; and a control unit, connected to said variable gain units and said power supply control units for controlling said variable gain units and said power supply control units, a first one of said variable gain units and a first one of said power supply control units connected to said first variable gain unit being activated by said control unit, so that said first power supply control unit turns ON the power supply applied to said first variable gain unit.

a second one of said variable gain units and a second one of said power supply control units connected to said second variable gain unit being deactivated by said control unit, so that said second power supply control unit turns OFF the power supply applied to said second variable gain unit.

7. The apparatus as set forth in claim 6, wherein said delay unit is controlled by said control unit, so that a delay time of each of said variable gain units is approximately constant regardless of a change of gain thereof.

* * * * *